(12) United States Patent
Geesey

(10) Patent No.: US 8,386,962 B2
(45) Date of Patent: Feb. 26, 2013

(54) SYSTEM AND METHOD FOR VIEWING DEVICE COMPONENTS

(76) Inventor: Neil Geesey, Phoenix, AZ (US)

(*) Notice: Subject to any disclaimer, the term of this patent is extended or adjusted under 35 U.S.C. 154(b) by 551 days.

(21) Appl. No.: 12/542,323

(22) Filed: Aug. 17, 2009

(65) Prior Publication Data

US 2010/0042952 A1 Feb. 18, 2010

Related U.S. Application Data

(60) Provisional application No. 61/089,638, filed on Aug. 18, 2008.

(51) Int. Cl.
*G06F 3/048* (2006.01)
(52) U.S. Cl. .......... 715/851; 715/810; 715/817
(58) Field of Classification Search .......... 715/851, 715/810, 817
See application file for complete search history.

(56) References Cited

U.S. PATENT DOCUMENTS

| | | | |
|---|---|---|---|
| 7,233,779 B2 * | 6/2007 | Mere et al. | 455/150.1 |
| 7,350,159 B2 * | 3/2008 | Cancilla et al. | 715/854 |
| 7,360,158 B1 * | 4/2008 | Beeman | 715/705 |
| 7,383,203 B1 * | 6/2008 | Feldstein et al. | 705/14.67 |
| 7,702,435 B2 * | 4/2010 | Pereira et al. | 701/30.8 |
| 8,161,374 B2 * | 4/2012 | Haberl | 715/212 |
| 8,198,994 B2 * | 6/2012 | Ferren et al. | 340/462 |
| 2007/0250232 A1 * | 10/2007 | Dourney et al. | 701/35 |

* cited by examiner

*Primary Examiner* — David Phantana Angkool
(74) *Attorney, Agent, or Firm* — Tiffany & Bosco, P.A.

(57) ABSTRACT

In a system for viewing the internal components of a device, a user interface is provided. Device selection criteria is received by the system from the user interface. After receiving the device selection criteria, a device model is retrieved from a database in accordance with the device selection criteria. The device model is displayed using the user interface. After displaying the device data, component or subsystem selection criteria is received from the user interface. Component or subsystem data is retrieved from the database, and the component or subsystem data is displayed using the user interface.

20 Claims, 10 Drawing Sheets

SYSTEM AND METHOD FOR VIEWING DEVICE COMPONENTS

CROSS-REFERENCE TO RELATED APPLICATIONS

This application is based on, claims the benefit of, and incorporates by reference U.S. Provisional Application Ser. No. 61/089,638 filed Aug. 18, 2008, and entitled "SYSTEM AND METHOD FOR VIEWING DEVICE COMPONENTS."

FIELD OF THE INVENTION

The present invention relates in general to an electronic display system and, more particularly, to a system and method of viewing the internal components and subsystems of a device.

BACKGROUND OF THE INVENTION

Often, in professional fields where service technicians provide repair or maintenance services to customers there exists a large knowledge gap between the professionals and their customers. As a result, customers may often have difficulty understanding the reasons for making a particular repair, or the benefits that the repair or a particular maintenance activity may provide. The lack of understanding can often lead to customer frustration and dissatisfaction with the service provider and the technician.

Because mechanical devices generally include a solid frame or covering, it is difficult to inspect the device's internal components to view their operation and to inspect their status. In some cases, it may even be dangerous to observe the internal workings of a particular engine or motor. As a result, it is difficult for a customer to observe the internal components and subsystems of a particular device and it can be problematic for a service technician to explain how the device operates. Furthermore, it may be difficult to explain why certain repairs are necessary and how they prevent damage or failure of one or more of the device's components.

SUMMARY OF THE INVENTION

In one embodiment, the present invention is a method of displaying a visual representation of an internal component of a vehicle. The method includes retrieving historical data for the vehicle. The historical data describes at least one of a use history and a maintenance history of the vehicle. The method includes receiving a view request from a user interface. The view request identifies a component of the vehicle. The method includes retrieving model data from a model database. The model data identifies a plurality of models of the component of the vehicle. Each of the plurality of models has one or more model triggers and include a visual representation of the component of the vehicle. The model triggers characterize a level of at least one of wear and damage of the component of the vehicle. The method includes evaluating each of the model triggers using the historical data, and when the model trigger for one of the plurality of models of the component of the device is satisfied, displaying the visual representation of the component of the one of the plurality of models using the user interface. The method includes displaying a list of available maintenance activities for the component of the vehicle using the user interface.

In another embodiment, the present invention is a method of viewing a visual representation of an internal component of a device. The method includes retrieving historical data for the device. The historical data describes at least one of a use history and a maintenance history of the device. The method includes receiving a view request from a user interface. The view request identifies at least one of a component and a system of the device. The method includes retrieving model data from a model database. The model data identifies a plurality of models of the at least one of a component and a system of the device. Each of the plurality of models has a model trigger and includes a visual representation of the at least one of a component and a system of the device. The method includes evaluating each of the model triggers using the historical data, and when the model trigger for one of the plurality of models of the at least one of a component and a system of the device is satisfied, displaying the visual representation of the at least one of a component and a system of the device using the user interface.

In another embodiment, the present invention is a computer-implemented method of viewing an internal component of a device. The method includes providing a user interface, receiving device selection criteria from the user interface, and retrieving a device model from a model database in accordance with the device selection criteria. The device model includes a visual representation of the device. The method includes displaying the visual representation of the device using the user interface, receiving component or subsystem selection criteria from the user interface, retrieving a component or subsystem model from a component or subsystem model database in accordance with the component or subsystem selection criteria, and displaying the component or subsystem model using the user interface.

In another embodiment, the present invention is a system for displaying a visual representation of an internal component of a vehicle. The system includes a user information database for storing historical data for the vehicle. The historical data describes at least one of a use history and a maintenance history of the vehicle. The system includes a model database for storing model data. The model data identifies a plurality of models of components of the vehicle. Each of the plurality of models has one or more model triggers and includes a visual representation of the components of the vehicle. The model triggers characterize a level of at least one of wear and damage of the component of the vehicle. The system includes a processor. The processor is configured to retrieve historical data for the vehicle from the user information database, and receive a view request from a user interface. The view request identifies a component of the vehicle. The processor is also configured to retrieve model data from the model database for the component of the vehicle, evaluate the model triggers of the model data using the historical data, and when a model trigger for one of the plurality of models of the component of the device is satisfied, display the visual representation of the component of the one of the plurality of models using the user interface.

DETAILED DESCRIPTION OF THE DRAWINGS

Figure 1:
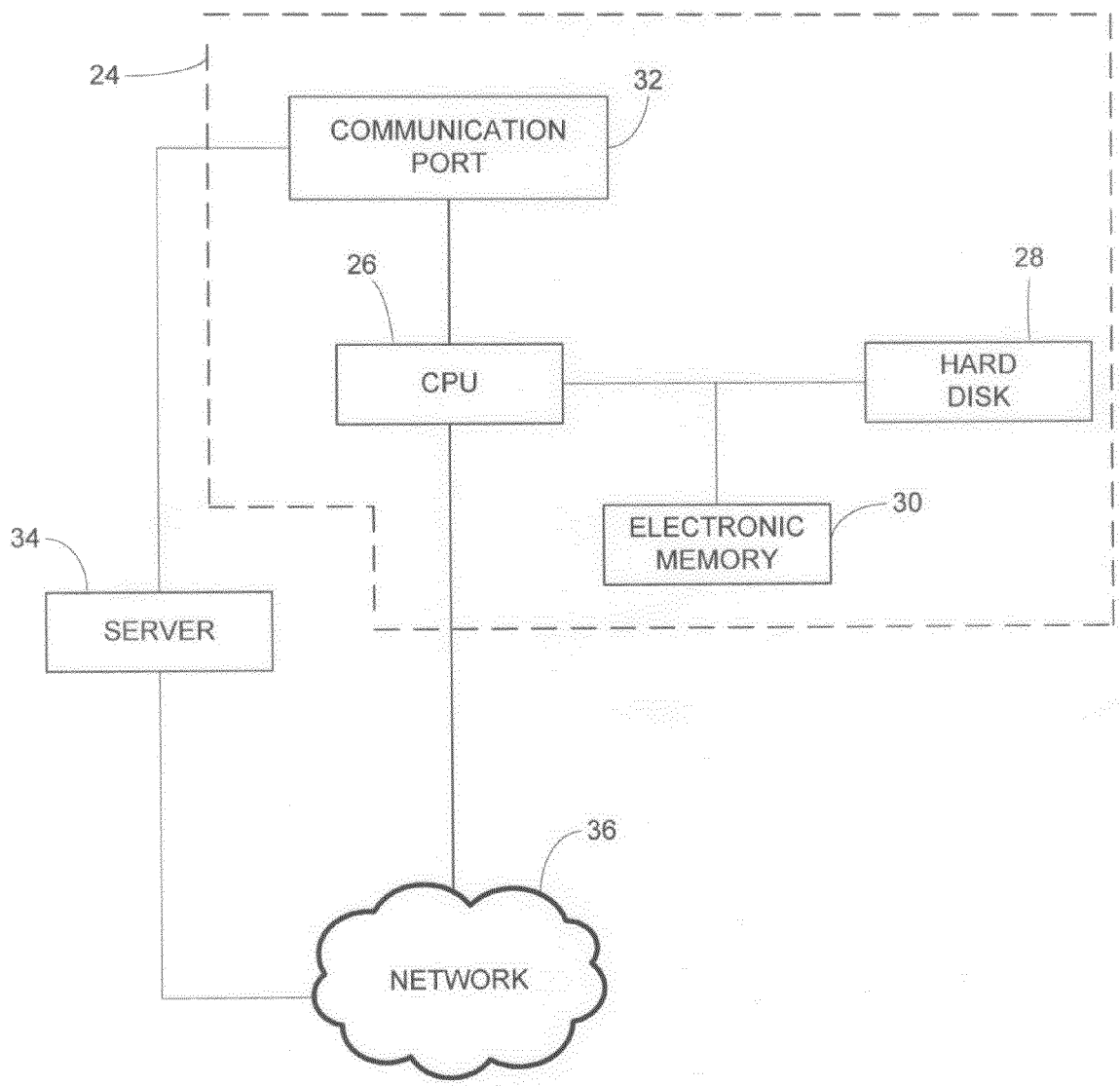
FIG. 1 illustrates a computer system and network for implementing the present system.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The present system provides an interactive visual demonstration to allow a consumer to peer through a solid device to observe the device's inner components and their operation. By viewing the internal components of the device, the user develops an understanding of how the internal components interact, operate, and provide the functionality of the device. The system can also be used to provide animations and/or images that illustrate the benefits of an appropriate maintenance routine. For example, by analyzing the use history for a particular device, the system can illustrate how a lack of routine maintenance could result in significant damage to one or more parts of the device causing malfunctions or even device failure.

The system includes a database that stores models of the devices and their internal components. The system stores information describing how the components interact and the importance of performing repairs and maintenance on the components. For example, in one embodiment, the system stores models of automobiles and other vehicles. The models provide an illustration of both the exterior of the vehicle and many of the internal components and subsystems of the automobile. The system stores data that describes how each component of the automobile interacts with the other components. The system may store models of other devices including home appliances such as washing machines, ovens and microwaves, industrial devices such as mills, tractors, or plows, or other devices that include one or more moving parts.

The models include text, graphics, video, animations, or other media for educating a user about the internal operation of the device. The text data describes each of the device's components, their functionality, and explains the purpose of servicing the components. The description also includes an explanation of why service is necessary, and a description of the damage that results from improperly maintained components. In one implementation, the models include a plurality of layered images and associated descriptions, however in other embodiments, the models include videos, animations, three-dimensional (3D) models, technical schematics and other data relating to the operation of the device.

The animations depict the operation of the internal components of the device. The animations show the device operating under normal conditions—for example, after being serviced or repaired. The system may store additional animations, however, that depict the components after failing to receive the proposed repair or maintenance. The animations show both damage to the selected component or subsystem and damage to other components or subsystems that result from poor repair or maintenance. For example, an animation of the valves of a car engine may be configured to illustrate damage that results from a failure to routinely change the oil in the engine. In some embodiments, still images are used to illustrate the operation of a particular device or to show damage that results from a failure to perform necessary repairs and maintenance.

In the present embodiment, the system outputs data to an interactive viewing screen. The screen provides a user interface that allows a user to view the various components or subsystems of the device. The user interface also provides controls for selecting a particular animation or zooming in on one or more components or subsystems of the device. Using the interface, a user can explore each of the components of the device and review data describing each component.

In one embodiment, as shown in FIG. 1, system 100 operates software for allowing a user to retrieve data describing one or more components within a device. The data includes visual, aural, and text data that describe one or more of the components of the device. Using the user interface provided by system 100, the user explores the inner working of the device and retrieves information describing a particular repair or maintenance activity. The information describes the normal operation of the device, the benefits of the repair or maintenance, and problems that may result if the repair or maintenance is not performed.

FIG. 1 illustrates system 100 including computer system 24. Computer system 24 is a general purpose computer including a central processing unit or microprocessor 26, mass storage device or hard disk 28, electronic memory 30, and communication port 32. Communication port 32 represents a modem, high-speed Ethernet link, or other electronic connection mechanism to transmit and receive input/output (I/O) data with respect to other computer systems.

Computer 24 is shown connected to server 34 by way of communication port 32, which in turn is connected to communication network 36. Server 34 includes mass storage devices, operating system code, and communication links for interfacing with communication network 36. Using communication network 36, server 34 provides an interface for transmitting and receiving data. Communication network 36 can be a local and secure communication network such as an Ethernet network, global secure network, or an open architecture network such as the Internet. Computer 24 transmits and receives information and data over communication network 36.

When used as a standalone unit, computer 24 is located in any convenient location. When used in conjunction with a computer network, computer 24 can be in any location with access to a modem or communication link to network 36.

Each computer runs application software and computer programs, which can be used to display user interface screens, execute the system functionality, and provide the features of the system as described hereinafter. In one embodiment, the screens and functionality come from locally-running application software, i.e., the system runs directly on one of the computer systems. Alternatively, the screens and functions are provided remotely from one or more websites or other remote interfaces communicated via the Internet. The websites are generally restricted access and require passwords or other authorization for accessibility. Communications through the website may be encrypted using secure encryption algorithms. Alternatively, the screens are accessible only on the secure private network, such as a Virtual Private Network (VPN), with proper authorization.

The software is originally provided on computer readable media, such as compact disks (CDs), magnetic tape, flash memory drives, or other mass storage medium. Alternatively, the software is downloaded from remote storage systems such as a host or vendor website. The software is installed onto a storage device accessible by server 34. In the present embodiment, system 100 is implemented as a website that is accessible by client computers via communication network 36. The software includes computer object language or scripting language that is executable by a web server. The web server executes system 100 and transmits the output to a client computer via communication network 36. System 100 may be implemented using any suitable web application programming language such as Adobe Flash, PHP:Hypertext Processor (PHP), or Active Server Pages (ASP). Alternatively, the software is executed as a stand alone software application and is installed to hard drive 28 of computer system 24, and is accessed and controlled by the computer's operating system. Software updates are electronically available on mass storage medium or downloadable from the host or vendor website. The software, as provided on the computer readable media or downloaded from electronic links, represents a computer program product usable with a programmable computer processor having a computer readable program code embodied therein. The software contains one or more programming modules, subroutines, computer links, and compilations of executable code which perform the functions of the system. The user interacts with the software via keyboard, mouse, voice recognition, and other user interface devices connected to the computer system.

The software stores information and data related to the system in a database or file structure located on any one of, or combination of, hard drives 28 or electronic memories 30 of computer 24, and/or server 34. More generally, the information used in the system can be stored on any mass storage device accessible to computer 24, and/or server 36. The mass storage device for storing the system may be part of a distributed computer system.

In the case of Internet-based websites, the interface screens are implemented as one or more webpages for receiving, viewing, and transmitting information related to the system.

For the present example, the system is developed as one software application for all end users, although the system could be implemented in multiple software modules or applications.

Figure 2:
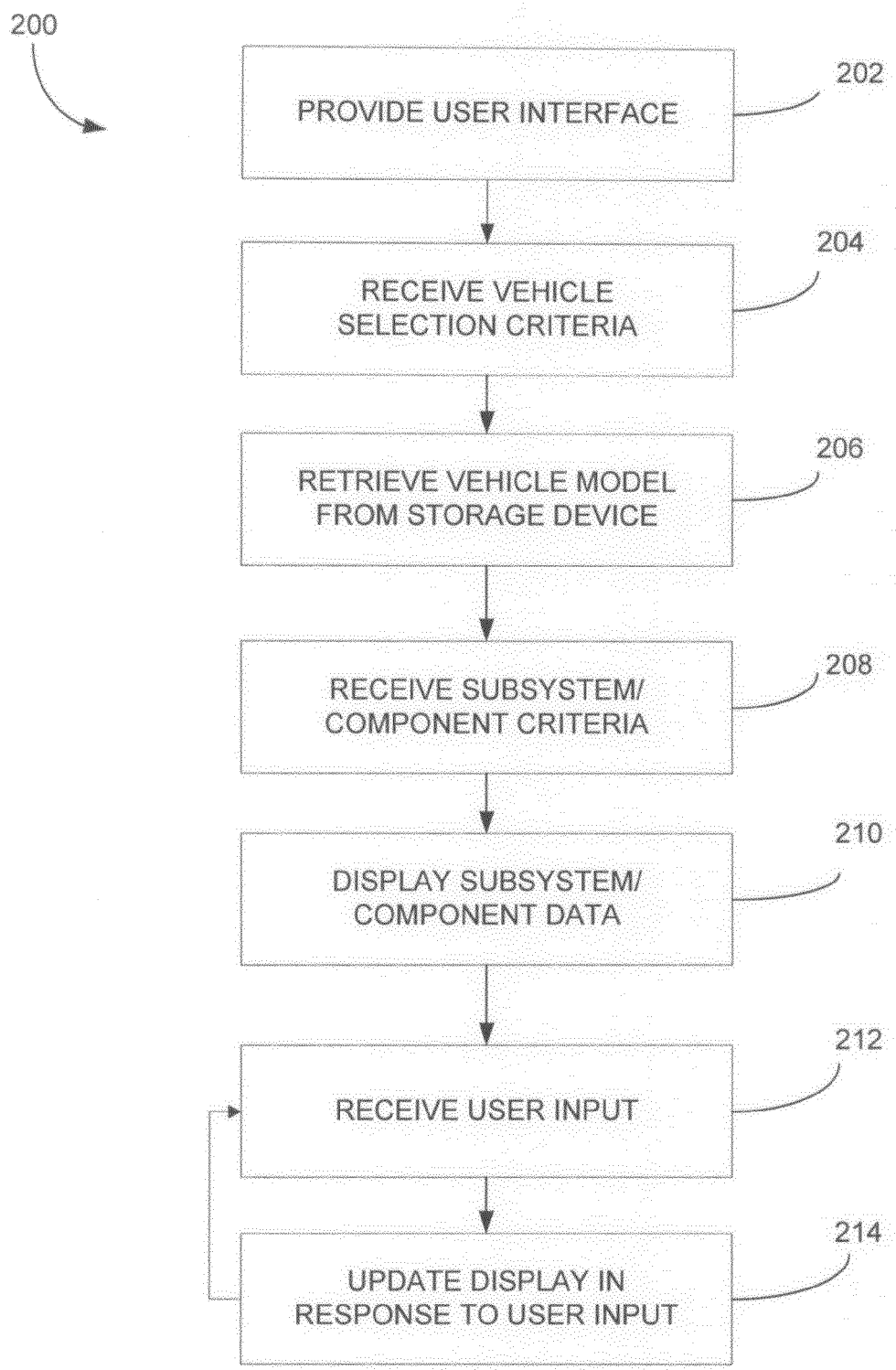
FIG. 2 is a flow-chart showing a method for implementing the present system.

FIG. 2 illustrates flow-chart 200 showing the operation of one embodiment of system 100 for illustrating the internal components and subsystems of a vehicle. In step 202 the system outputs a user interface. The user interface is outputted to a computer monitor or other display device. The user interface includes one or more controls that are activated by a user to control the operation of system 100. One or more user input devices such as a keyboard and mouse are connected to computer 24 to allow a user to explore the user interface and to provide user input. For example, the user can scroll through one or more webpages, input data via a keyboard, or make selections by clicking and moving the mouse. In the present embodiment, the output is displayed via a webpage. The webpage is configured to receive user input and may be prepared using a flash-based computer programming language, for example.

In step 204, the system receives vehicle selection criteria. Using the user interface provided by system 100, the user browses through a listing of available vehicles (or other devices) for which system 100 has available models. In one embodiment, the user may first select from a make or type of vehicle (e.g., truck, motorcycle, sedan, etc.). In alternative embodiments, the user selects from a listing of home appliances (including refrigerators, washers, and dryers), personal computers, boats, or home air-conditioning units, for example.

After receiving the user input, system 100 provides a listing of available vehicle models that fit within the make or type of vehicle selected by the user. If the user's specific vehicle is unavailable, the user interface includes a listing of similar or generic vehicle models that can be reviewed by the user. In an alternative embodiment, wherein the user selects from list of home appliances, industrial equipment, or other devices, system 100 presents the user with a listing of available device models that fit within the category selected by the user.

After receiving vehicle selection criteria in step 204, system 100 retrieves the vehicle model data from the appropriate storage device in step 206. In step 206, the model may be retrieved from a local storage device on computer 24 such as hard disk 28 or electronic memory 30. Alternatively, the model is retrieved from a storage device connected to server 34 via communication network 36. In one embodiment, the model includes layered images. Each layer provides an illustration of one or more components or subsystems of the vehicle. By varying the transparency of each of the layers, different components or subsystems of the vehicle can be displayed via the user interface of system 100. After outputting the model via the user interface of system 100, the user is presented with a representation of the entire vehicle. The user can use system 100 to get general overviews of the operation of the vehicle or to review recommended repairs and/or maintenance. As the user moves the mouse over the vehicle, various components or subsystems are highlighted to indicate that additional data describing those components are available. Alternatively, the user uses an input device to zoom in on various parts of the vehicle to review the components and subsystems in greater detail.

In step 208, system 100 receives subsystem or component selection criteria from the user. Using the user interface, the user explores the vehicle model to review the subsystems and components for which system 100 can provide additional information. After exploring the vehicle, the user selects a component or subsystem to review in further detail. Example subsystems include the braking, exhaust, electronic, air-conditioning, or suspension systems. The user interface allows a user to select a component or subsystem by clicking the component or subsystem, selecting from a list of components or subsystems, or right-clicking on the user-interface to generate a listing of available components or subsystems. In the present embodiment, each component is identified when the cursor is pointed at it. Similarly, system 100 provides a description of how the component operates as the user moves the cursor over each component of the vehicle. System 100 may also show components in motion or allow the user to operate them via the user interface. After making a selection, the component or subsystem selection criteria is transmitted to system 100 which updates the user interface in accordance with the selection criteria.

In step 210, after receiving the subsystem or component selection criteria, the system displays data for the selected subsystem or component in step 210. The data includes text, video, graphics, or animations that describe how the component or subsystem operates and how the component or subsystem interacts with the rest of the vehicle. The data also describes the function of each component or subsystem and provides a description or illustration of the component or subsystem when it operates in good working order. System 100 also describes service intervals for the component or subsystem and the benefits of proper and timely maintenance via the visual representation. Conversely, system 100 may provide examples illustrating damage to the component or subsystem as a result of lack of maintenance. If the particular component has an established service life, system 100 provides information describing the service life of the component and the process for replacing the component.

To display the component or subsystem data in step 210, system 100 retrieves data describing the selected component or subsystem from a local storage device on computer 24 such as hard disk 28 or electronic memory 30. Alternatively, the data may be retrieved from a storage device connected to server 34 via communication network 36. After retrieving the data, it is displayed via the user interface.

Figure 3:
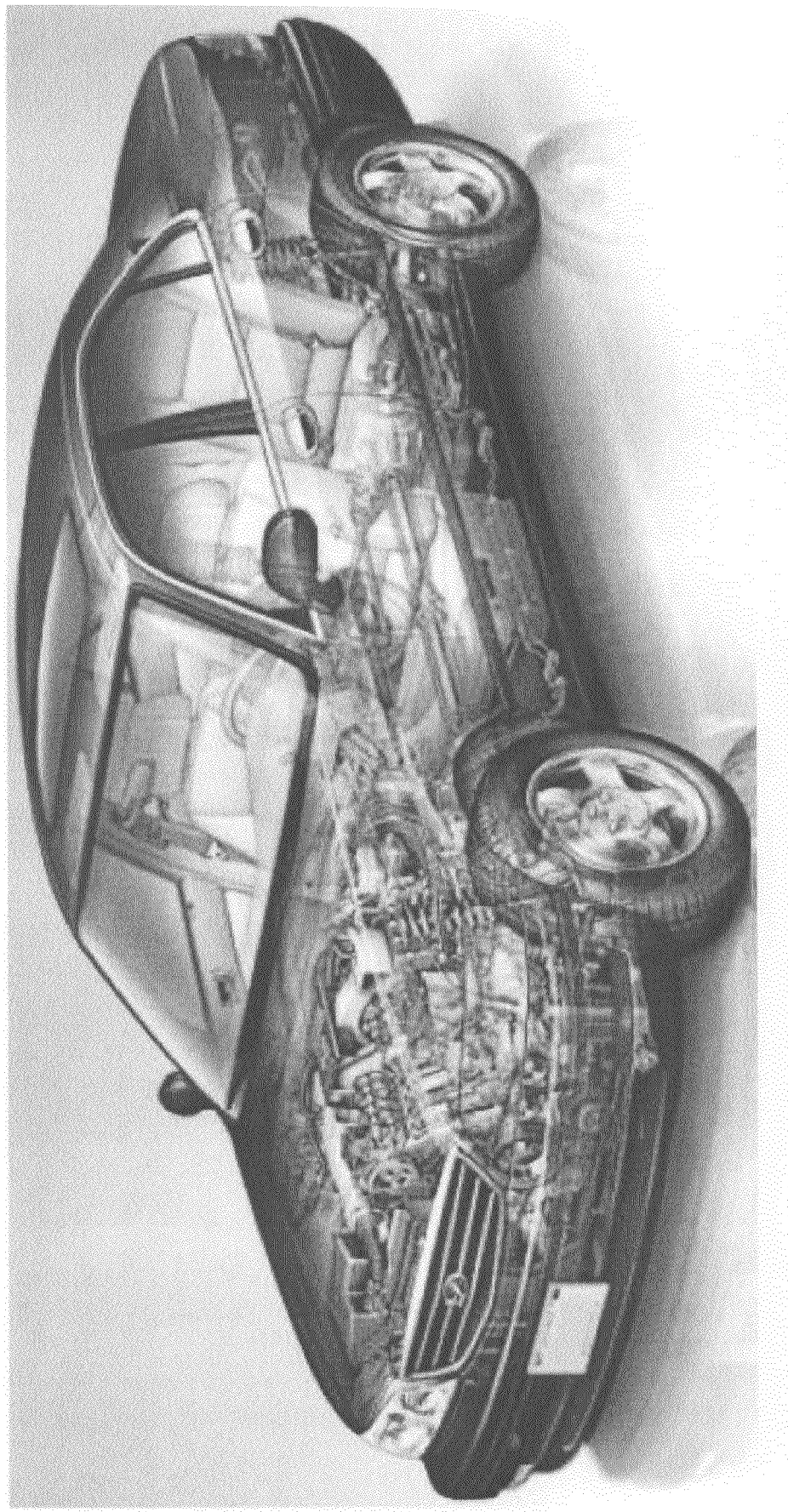
FIG. 3 depicts an output image showing a vehicle, wherein the outer covering of the vehicle (including its body, windows, wheels, and tires) have been rendered transparently to expose various components of the engine, drive train and suspension.
Figure 4:
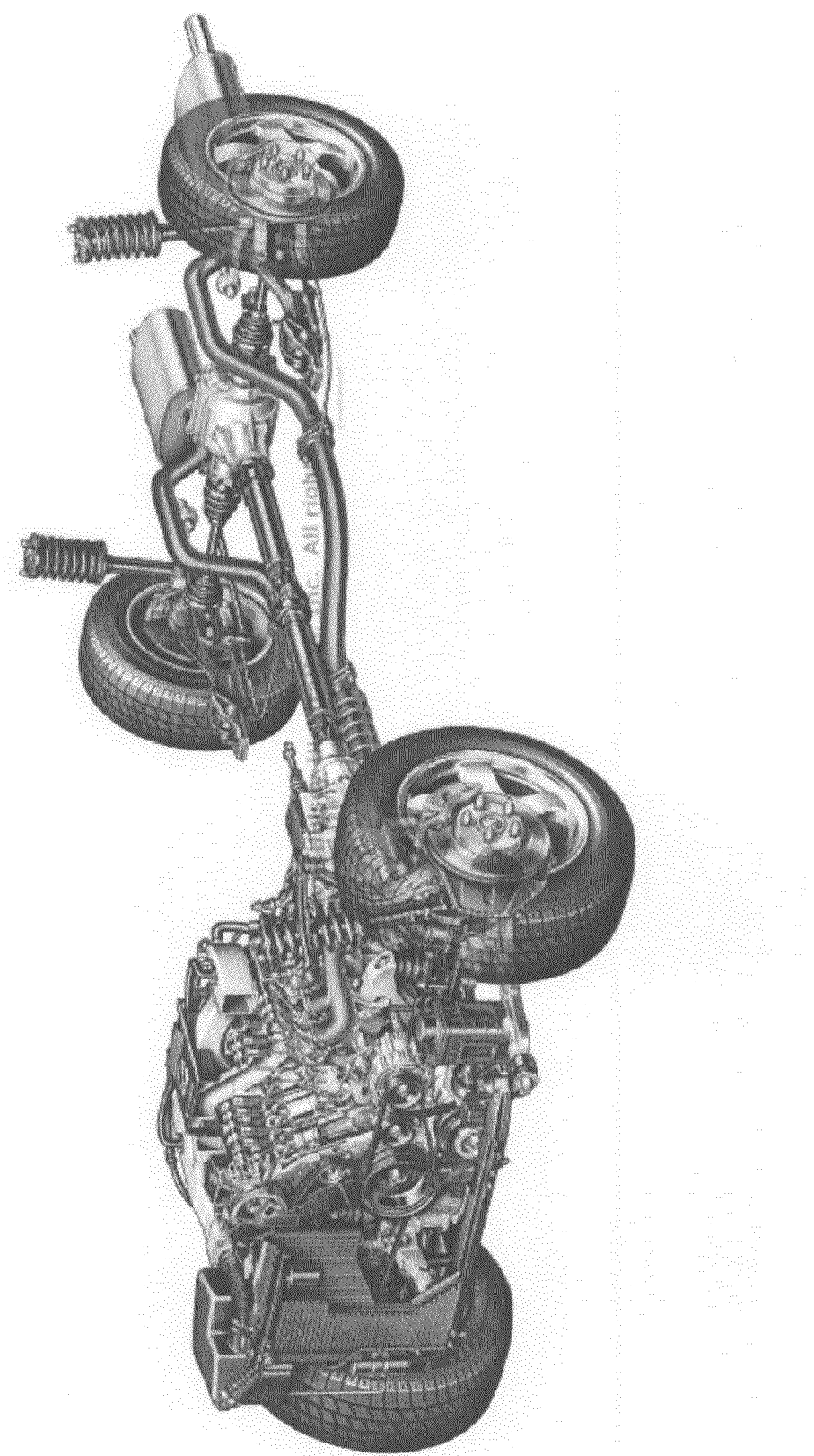
FIG. 4 shows a view of an engine and power train of a vehicle showing the operation and configuration of the engine.

FIGS. 3-4 illustrate example output generated by system 100 in step 210 of FIG. 2 after a user has selected a particular make and model of vehicle and has also selected a particular component or subsystem to review. In response to the selection, system 100 outputs an image of the vehicle with the selected component or subsystem shown in detail. The other parts of the vehicle are rendered in a transparent or hidden fashion so as to minimize interference with the display of the selected component or subsystem. The display may include an accurate life-like rendering of the component or subsystem (for example, by displaying a photograph, or actual video), a computer rendering of the component or subsystem, a drawing of the component or subsystem, a blue-print of the component or subsystem, or some other representation that illustrates the component or subsystem.

FIG. 3 depicts an output image showing a vehicle, wherein the outer covering of the vehicle (including its body, windows, wheels, and tires) have been rendered transparently to expose various components of the engine, drive train and suspension. FIG. 4 shows a view of an engine and power train of a vehicle showing the operation and configuration of the engine.

When illustrating one of the subsystems or components of a vehicle or device, system 100 may include a rendering of the entire vehicle with certain parts made transparent or removed to expose the enclosed subsystems or components. Alternatively, only the selected subsystem or components may be displayed by system 100. For example, system 100 may illustrate the wheel and steering assembly for an particular automobile. Various additional electronic components or subsystems may also be illustrated.

FIGS. 3-4 illustrate example graphics or illustrations that are displayed by system 100 to allow a user to explore various subsystems and components of an automobile to develop an understanding of how each component operates (as shown by example step 210 of FIG. 2). The illustrations help a repair technician explain why particular repairs are necessary or why routine maintenance is important. In alternative embodiments, the illustrations are animated to show the actual operation and interaction of each of the components. Additional textual information is provided to further describe the subsystems and components and to educate the user.

Returning to FIG. 2, in step 212, the user reviews the output generated by step 210 and, via the user interface, provides additional user input to system 100. In one example, system 100 first outputs an illustration of the selected component or subsystem operating in a normal manner. However, system 100 also provides a control that allows the user to select from a listing of alternative representations of the selected component or subsystem. The alternative representation includes different views of the component or subsystem that show damage that may result from a failure to perform a particular repair or to perform routine maintenance. If the component or subsystem can be upgraded or otherwise improved, an alternative representation shows the component or subsystem after the improvement is implemented. While viewing a particular component or subsystem, system 100 may provide a user interface that allows a user to shop for particular replacement parts, upgrades kits, or service activities.

Figure 5:
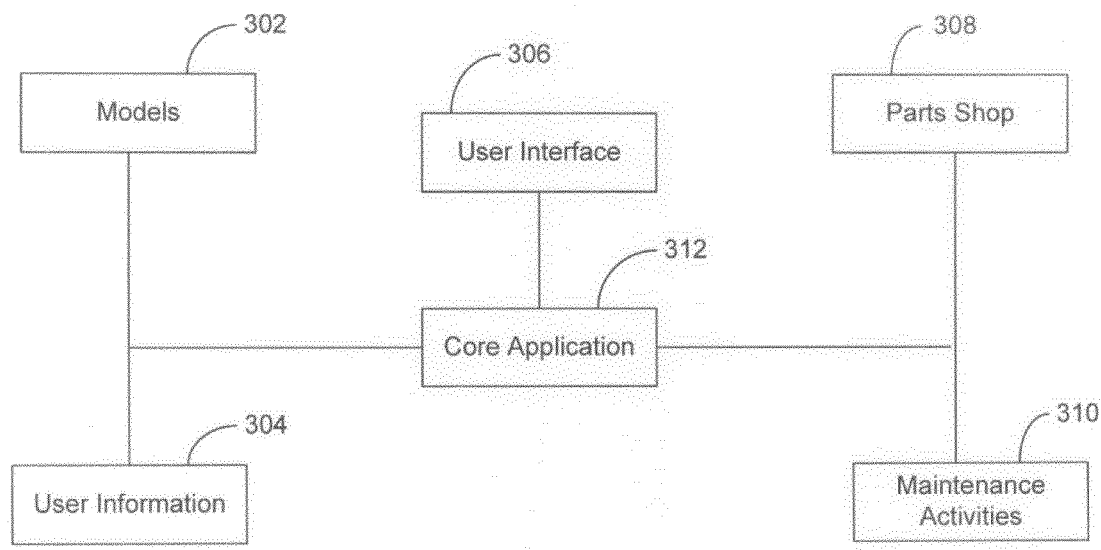
FIG. 5 illustrates a computer system and network for implementing an alternative implementation of the present system.

FIG. 5 is an illustration of an alternative implementation of the present system. System 300 includes model database 302, user information database 304, user interface 306, parts database 308, maintenance activities database 308, and core application 312. Within system 300, core application 212 may retrieve data from any combination of databases 302, 304, 308 and 310 and analyze historical information relating to the prior use and maintenance history of a vehicle (or, in other implementations, other devices such as home appliances, personal computers, boats, home air-conditioning units, etc.) provide maintenance activity recommendations, and output visual models such as animations, photographs, sketches, or other information describing one or more components of the vehicle. For example, the present system may analyze the prior use and maintenance history of a vehicle and determine that a particular component or components may be damaged or running inefficiently in view of the use and maintenance history. After performing the analysis, the system may output model data via user interface 206 illustrating the effects that the prior use and/or maintenance history may have had on one or more components of the vehicle.

Model database 302 stores models of vehicles and components of vehicles as used by the present system. The models may include 3D visualizations of the vehicle or components of the vehicle, and photographs or technical drawings. In the case of 3D visualizations, user interface 306 may allow a user to rotate, zoom-in on, or explode the 3D visualization. In some implementations, the models include animations to show the components of the vehicle during operation. The models may be implemented using a flash programming language, or other languages suitable for representing 3D models or visual images using a computer interface. Alternatively, the models may include videos (e.g., AVI, MP4, etc.), still images (e.g., JPEG, TIFF, etc.), or other digital files configured to display information for a user via a user interface.

In system 300, the models stored in model database 302 may be configured to show both a normal operation of the component or vehicle, or an inefficient or defective operation. For example, model database 302 may include models that show the operation of a valve assembly of an automobile operating normally after routine maintenance, and models that show the operation of the valve assembly after the engine oil has not been changed for an extended period of time. As another example, the models may show a transmission operating normally, and a transmission operating after a lifetime of use in a truck that pulls extremely heavy trailers or that operates in extreme environments. In one example implementation, model database 302 may include a structure according to Table 1.

TABLE 1

| MODEL NAME | MODEL TYPE | VEHICLE MAKE | VEHICLE MODEL | MODEL THRESHOLD TRIGGER |
|---|---|---|---|---|
| Valves - good condition | 3D Model | FORD | FOCUS | Last oil change < 3 months ago |
| Valves - bad condition | 3D Model | FORD | FOCUS | Last oil change > 1 year ago |
| Transmission - good condition | image | CHEVROLET | SILVERADO | Last fluid change < 30,000 miles ago |
| Transmission - poor condition | image | Generic Truck | Generic Truck | Last fluid change > 30,000 miles ago |
| Transmission - bad condition | images | CHEVROLET | SILVERADO | Last fluid change > 30,000 miles ago and vehicle miles > 200,000 and towing status = heavy and climate = hot |
| Vehicle Body - salt damage | images | Generic | Generic | climate = snow |

As shown in example Table 1, model database 302 may store model information for many different vehicle makes and models, and their respective components. The models may illustrate vehicle components in normal working order, or may show components that are in poor condition, or about to fail. Each model, whether it includes an animation, 3D model, or image, may be associated with a particular vehicle model, or a generic vehicle model.

In the present example, a model threshold trigger is defined for each model. The model threshold trigger includes one or more logical statements which, if satisfied, indicate a particular model is most likely to accurately represent a vehicle's components and should be displayed. In one implementation, the present system retrieves maintenance history (and, optionally, any available use history) for a particular vehicle and uses the model triggers to display models that more accurately illustrate the likely condition of the internal components of the vehicle. For example, if the oil has not been change in a user's vehicle for an extended period of time, rather than display a model showing an engine in perfect working order, the system may display a model that shows an engine with damage resulting from the lack of maintenance so the user can view the possible results of that maintenance history.

In one example, if a user owning a FORD FOCUS wishes to view a model showing the operation of the valve structure of the engine of the vehicle, the system may first retrieve the maintenance history for the user's vehicle from user information database 304. If the vehicle has received an oil change in the last 3 months, the system retrieves the "Valves—good condition" model for the FORD FOCUS and displays that model for the user using user interface 306 in accordance with the model trigger shown in Table 1. In contrast, if the vehicle has not been serviced recently, and has not received an oil change in the last 3 months, the system retrieves the "Valves—bad condition" model and displays that instead. The "Valves—bad condition" model may show the valves exhibiting certain wear and tear or damage that result from a failure to routinely change the oil of the vehicle.

Depending upon the system implementation, the model threshold triggers may include several different triggers that relate to different maintenance activities and/or use history for a particular vehicle. The different triggers may be "ANDed" or "ORed" together in the triggers column, or may alternatively be used as multipliers to adjust when a particular model is illustrated. For example, the "Transmission—bad condition" model described in Table 1 is only displayed if the transmission fluid has not been change in over 30,000 miles, the vehicle has over 200,000 miles, the vehicle is used for heavy towing activities, and the vehicle is resident in a hot climate. Any appropriate combination of maintenance triggers may be used to determine when the system will display a particular model.

In some cases, a user's vehicle may be so far behind in maintenance and/or be subject to such extreme uses that the system will not display a model because it is too difficult to predict how the part is currently operating. For example, in some cases, rather than show a particular model for a component of a vehicle, the system will instead only recommend that the part be replaced.

In general, the models may be associated with a single vehicle make and vehicle model. However, in some cases, the models may be associated with all models of a vehicle, for a given vehicle make, or be labeled "Generic" meaning the models are applicable to all vehicles.

User information database 304 includes data describing a user's vehicle and that vehicle's maintenance and use history. For example, user information database 304 may include a record of all maintenance and/or repair activities performed on the user's vehicle. The database may store information describing why particular repairs were performed and when new or refurbished parts were added to the vehicle. User information database 304 may store the current number of miles of the vehicle, and the vehicle's make, model and year. The current geographical location of the vehicle may also be stored, allowing core application 312 to retrieve the location and determine ambient characteristics of the location such as average temperatures, rainfall, snowfall, and humidity, to modify the times at which particular maintenance activities are recommended, for example.

User information database 304 may also store information describing a use history of the vehicle. Information such as whether the vehicle is used for towing or racing could be stored. The average number of miles driven per month and any vehicle modifications or upgrades could also be stored.

The information stored in user information database 304 may be entered manually, for example by the user or another operator. Alternatively, the information may be retrieved automatically from a computer database operated by a vehicle maintenance facility that stores records of prior maintenance and/or repair activities. In other situations, where the vehicle is old and/or has had many different prior owners, it may be difficult to determine the prior use and/or maintenance history for the vehicle. In that case, a default history for the vehicle may be established. The default maintenance history may be based upon an analysis of the prior maintenance and use histories for other similar vehicles.

User information database 304 may store the vehicle use and/or maintenance information in a tabular format allowing for efficient retrieval by core application 312 for processing. Any of the information stored in user information database 304 may be used in the model threshold triggers of model database 302 and the maintenance threshold triggers of maintenance activities database 310.

User interface 306 may include an interactive viewing screen. The screen provides a user interface that allows a user to view the various components or subsystems of the device displayed via one or more of the models of model database 302. The user interface may also provide controls for selecting a particular animation or zooming in on one or more components or subsystems of the device. Using the interface, a user can explore each of the components of the device and review data describing each component.

Core application 312 operates software for allowing a user to retrieve models illustrating one or more components within a device and maintenance activities that may be applied to the device. The models may include visual, aural, and text data that describe one or more of the components of the device. Using user interface 306 of system 300, the user communicates with core application 312 to explore the inner workings of the device and retrieve information describing a particular repair or maintenance activity. The information may describe the normal operation of the device, the benefits of the repair or maintenance, and problems that may result if the repair or maintenance is not performed.

Parts database 308 includes a listing of available parts. Each of the parts in parts database 308 may be associated with a particular vehicle and vehicle model, or, alternatively, with a collection of different types of vehicles. For example, a part may be generic to a whole collection of vehicle models. Parts database 308 may be configured to store pricing, warranty, or other descriptive information for each of the parts.

Maintenance activities database 310 includes a listing of candidate maintenance activities and/or repairs that may be performed on a vehicle. Each of the maintenance activities and/or repairs may be associated with a particular vehicle model, or a collection of vehicle models. Maintenance activities database 310 may store a description of each of the maintenance activities and/or repairs as well as an estimated number of hours to complete and an estimated cost. In one example implementation, maintenance activities database 310 may be structured accordingly to Table 2.

TABLE 2

| MAINTENANCE ACTIVITY | VEHICLE MAKE | VEHICLE MODEL | DESCRIPTION | ESTIMATED HOURS | MAINTENANCE TRIGGER |
|---|---|---|---|---|---|
| Change Oil | Generic | Generic | Change engine oil . . . | 1.5 Hours | Miles since last oil change > 3,000 OR months since last oil change > 3 |
| Change Transmission Fluid | FORD | F-150 | Change transmission fluid . . . | 3.0 Hours | (Miles since last transmission fluid change > 30,000) OR (Miles since last transmission fluid change > 15,000 AND vehicle is used for heavy towing) |
| Under-body protection | Generic | Generic | Apply salt protection layer to underbody of vehicle | .5 Hours | location = snow AND under-body protection not applied for > 2 years |
| Change coolant | Generic | Generic | Change vehicle coolant fluids | 1 Hour | (location = desert AND miles since coolant changed > 30,000) OR (miles since coolant changed > 50,000) |

As shown in Table 2, the change oil maintenance activity is generic to all vehicle makes and all vehicle models. There are two triggers defined for the change oil maintenance activity. The first is that the vehicle has driven more than 3,000 miles since the last oil change. The second trigger is that it has been more than three months since the last oil change. If core application 312, after reviewing user information database 304 for a particular vehicle, determines that either of the triggers have been satisfied, core application 312 may recommend the change oil maintenance activity to a user via user interface 306.

The under-body protection maintenance activity is generic to all vehicles and is recommended every two years. However, the activity will only be recommended for vehicle that resides in a location where snow is prevalent and, as a result, the roads are likely to be salted. Conversely, the change coolant maintenance activity is recommend every 50,000 miles for most vehicles, but every 30,000 miles for vehicles that reside in the desert. Note that the location triggers could be replaced by triggers that relate to zip codes, states, Global Positioning System (GPS) coordinates, or any other mechanisms for describing a location of the vehicle.

The triggers for the maintenance activities database 310 may reference any combination of the information stored in user information database 304 and any other pre-defined triggers. The pre-defined triggers may be established for each of the maintenance activities and be based upon other factors such as the time period or miles driven since the last maintenance activity, other maintenance activities performed, the presence of certain modifications or upgrades in the vehicle, etc.

Figure 6:
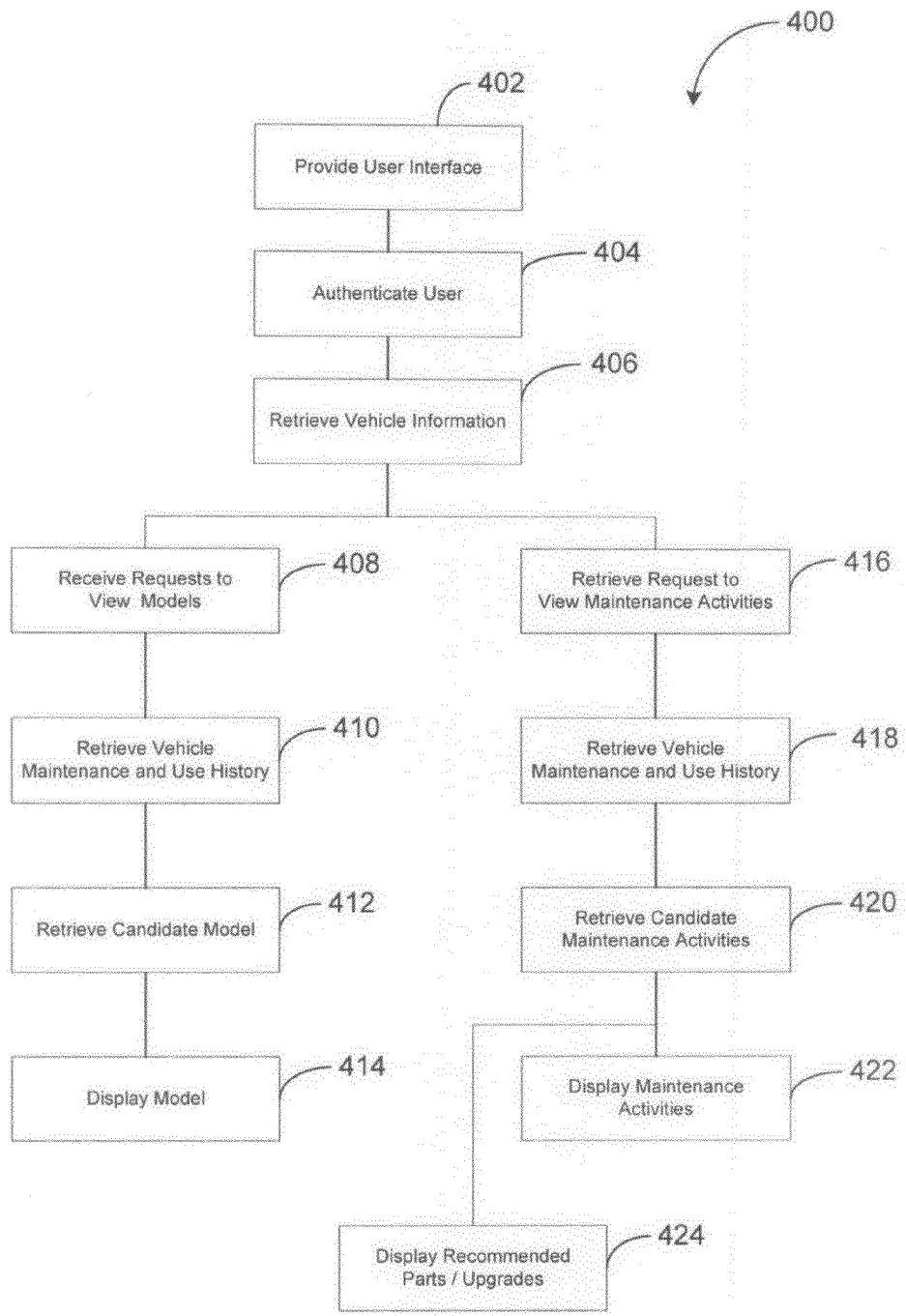
FIG. 6 is a flow-chart showing a method for implementing the system of FIG. 5.

FIG. 6 is a flow-chart showing an example operation of system 300 as illustrated in FIG. 5. In step 402 the system outputs a user interface. The user interface may be outputted to a computer monitor or other display device. The user interface includes one or more controls that are activated by a user to control the operation of system 300. User interface 306 may include one or more user input devices such as a keyboard and mouse that are connected to computer 24 to allow a user to explore the user interface and to provide user input. For example, the user can scroll through one or more webpages, input data via a keyboard, or make selections by clicking and moving the mouse. In one implementation, the output is displayed via a webpage. The webpage is configured to receive user input and may be prepared using a flash-based computer programming language, for example.

In step 404, system 300 authenticates the user. This may be done by requiring the user to submit a username and password. Alternatively, the user may be authenticated using payment information, or any other information that uniquely identifies the user. Alternatively, the system may not authenticate the user and instead allow the user to browse all the models and maintenance activities anonymously and without specifying a particular vehicle. For example, instead of authenticating, the user may select a type of vehicle from a menu list and review the models and maintenance activities associated with that vehicle.

After authenticating the user, system 300 retrieves vehicle information for that user in step 406. For example, system 300 may retrieve the make and model of the user's vehicle from user information database 304. If user information database 304 has records for multiple vehicles for the user, system 300 may require the user to select one of the multiple vehicles before proceeding.

After identifying the user's vehicle (or after the user has selected one of multiple vehicles) in step 406, system 300 allows a user to navigate the available visual models for the selected vehicle, or to view the maintenance activities associated with the selected vehicle.

In step 408, system 300 receives a request to view models associated with the selected vehicle. The request may identify a particular subsystem of the car for which a model is available. For example, system 300 may present the user with an image of the vehicle allowing the user to select a component or subsystem to review in further detail by clicking on the image of the vehicle. Example subsystems include braking, exhaust, electronic, air-conditioning, or suspension systems. In this example, user interface 306 allows a user to select a component or subsystem by clicking the component or subsystem, selecting from a list of components or subsystems, or right-clicking on the user-interface to generate a listing of available components or subsystems.

After receiving the request to view a model for a particular subsystem, system 300 retrieves the use history and maintenance history for the user's vehicle from user information database 304 in step 410. With the vehicle use history and maintenance history, system 300 can review all models for the components that are included in the user's vehicle. For each of the models of the selected component, system 300 compares the use history and maintenance history to the model threshold triggers defined for each model to identify the most appropriate model to display.

In step 412, an appropriate model is retrieved from model database 302 and in step 414 the model is displayed via user interface 306. Because the model was selected in view of the use history and maintenance history of the user's vehicle, the model displayed via user interface 306 will illustrate that same component in the user's vehicle and mimic the same level of wear and/or deterioration as the part in the user's vehicle.

Having displayed the model, system 300 may then retrieve maintenance activities that can be performed involving the selected component and that are called for in view of the user's vehicle's maintenance and use history. A list of candidate maintenance activities may be displayed via user interface 306 for review by the user. The user may then select one of the maintenance activities to view additional information such as a description, recommend replacement parts, estimated cost, and estimated number of hours for completion.

Alternatively, after displaying the user's vehicle, the user may wish to review all maintenance activities that may be performed on the vehicle. Accordingly, in step 416 system 300 receives a request to view all available maintenance activities via user interface 306. In one implementation, the user may optionally submit a request to see all maintenance activities that relate to a single component or sub-system of the vehicle.

In step 418, after receiving the request to view the available maintenance activities to the vehicle, system 300 retrieves the user's vehicle maintenance and use history in step 418 from user information database 304.

After retrieving the use history and maintenance history for the vehicle in step 418, system 300 retrieves all candidate maintenance tasks that are suitable for the user's vehicle in view of the user history and maintenance history of the vehicle. Accordingly, in one implementation, system 300 compares the vehicle make, vehicle model and maintenance triggers for all maintenance activities in maintenance activities database 310 to the user's vehicle make, vehicle model, and the use and maintenance history of the user's vehicle. After determining which of the available maintenance activities are candidate maintenance activities (e.g., because one of more triggers has been met by the use and maintenance history of the vehicle), the candidate maintenance activities are retrieved from maintenance activities database 310 in step 420.

After retrieving the candidate maintenance activities, the candidate maintenance activities are displayed via user interface 306 in step 422. After displaying the maintenance activities, the user can select one of the maintenance activities to review any details including estimate cost and duration, any necessary parts, and to view any available models relating to the maintenance activity.

In some cases, in addition to displaying candidate maintenance activities in step 422, the system will recommend the installation of new parts or upgrades in step 424. In one implementation of system 300, maintenance activities database 310, in addition to storing a listing of maintenance activities, includes listings of new part installations that may be recommended based upon the vehicle's use and maintenance history, or other characteristics (e.g., adding a highperformance torque-converter in trucks that are subject to frequent heavy towing). In some cases, the system may even make recommendations for the purchase of a new vehicle.

Figure 7:
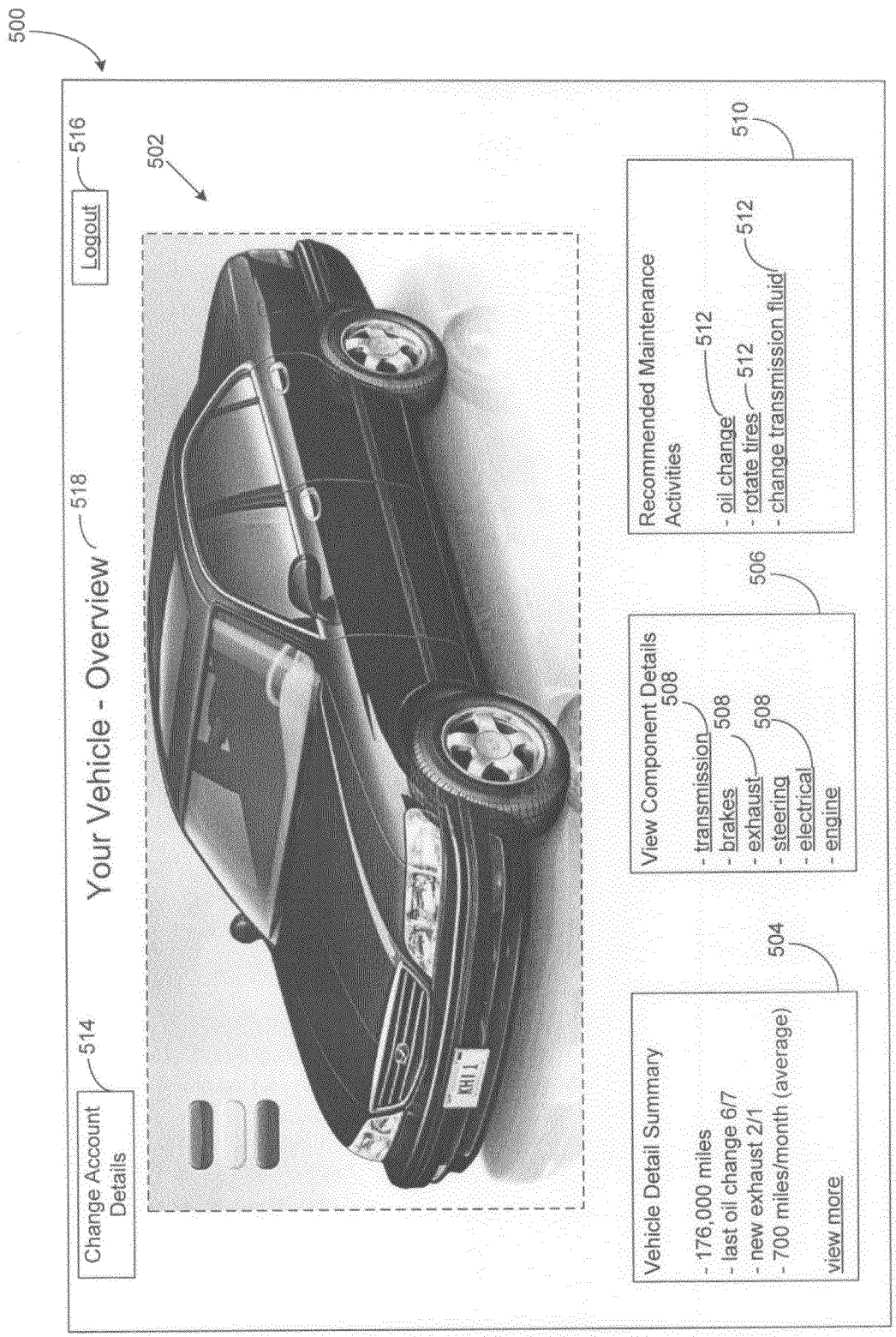
FIG. 7 illustrates an example user interface of the system that may be provided by a display screen such as a computer monitor, television screen, touch screen monitor, or other viewing system.

FIG. 7 illustrates example user interface 500 of the present system. User interface 500 may be provided by a display screen such as a computer monitor, television screen, touch screen monitor, or other viewing system. In the present example, user interface 500 is implemented by a computer system and includes a webpage. User interface 500 shows model 502 illustrating the exterior portion of a vehicle having the same make and model as the currently-logged-in user's vehicle. In one implementation of the present system, after a user logs into the system and after the user's vehicle information is retrieved, the default screen shows a model providing an overview of the user's vehicle, as shown in FIG. 7. As discussed above, model 502 may include videos, animations, three-dimensional (3D) models, technical schematics and other data relating to the operation of the device.

Vehicle detail summary 504 provides a brief summary of the use history and maintenance history of the user's vehicle. Depending upon the system implementation, a user may be able to select one or more of the summary items to view additional information. A link may also be provided to allow a user to view all use history and maintenance history details for the user's vehicle.

View component details section 506 allows a user to select from a listing of available component or subsystem models to view additional detail of the various components of the vehicle. In this example, view component details section 506 includes links to several specific components 508 that each allow a user to view additional detail of a particular component (or, alternatively, a subsystem) of the vehicle. Alternatively, the user may select a particular component or subsystem by clicking on or otherwise selecting a portion of the vehicle illustrated in model 502. For example, a user may position the mouse cursor over the hood of the vehicle and click to select the engine component or subsystem.

Recommended maintenance activities section 510 includes a listing of recommended vehicle maintenance activities. Each maintenance activity 512 may be selected after core application 412 (see FIG. 6) reviews the use history and maintenance history of the user's vehicle to determine which maintenance activities may be necessary. The user may click on each maintenance activity 512 to view additional information such as a description, estimated cost, estimated number of hours to complete, recommended parts, and the like.

User interface 500 includes change account details button to allow a user to modify account details. Also, after the user is finished with the system, logout button 516 allows the user to exit the system and prevent others from reviewing their vehicle information. Title 518 is provided to give the user an brief description of the information displayed via user interface 500.

Figure 8:
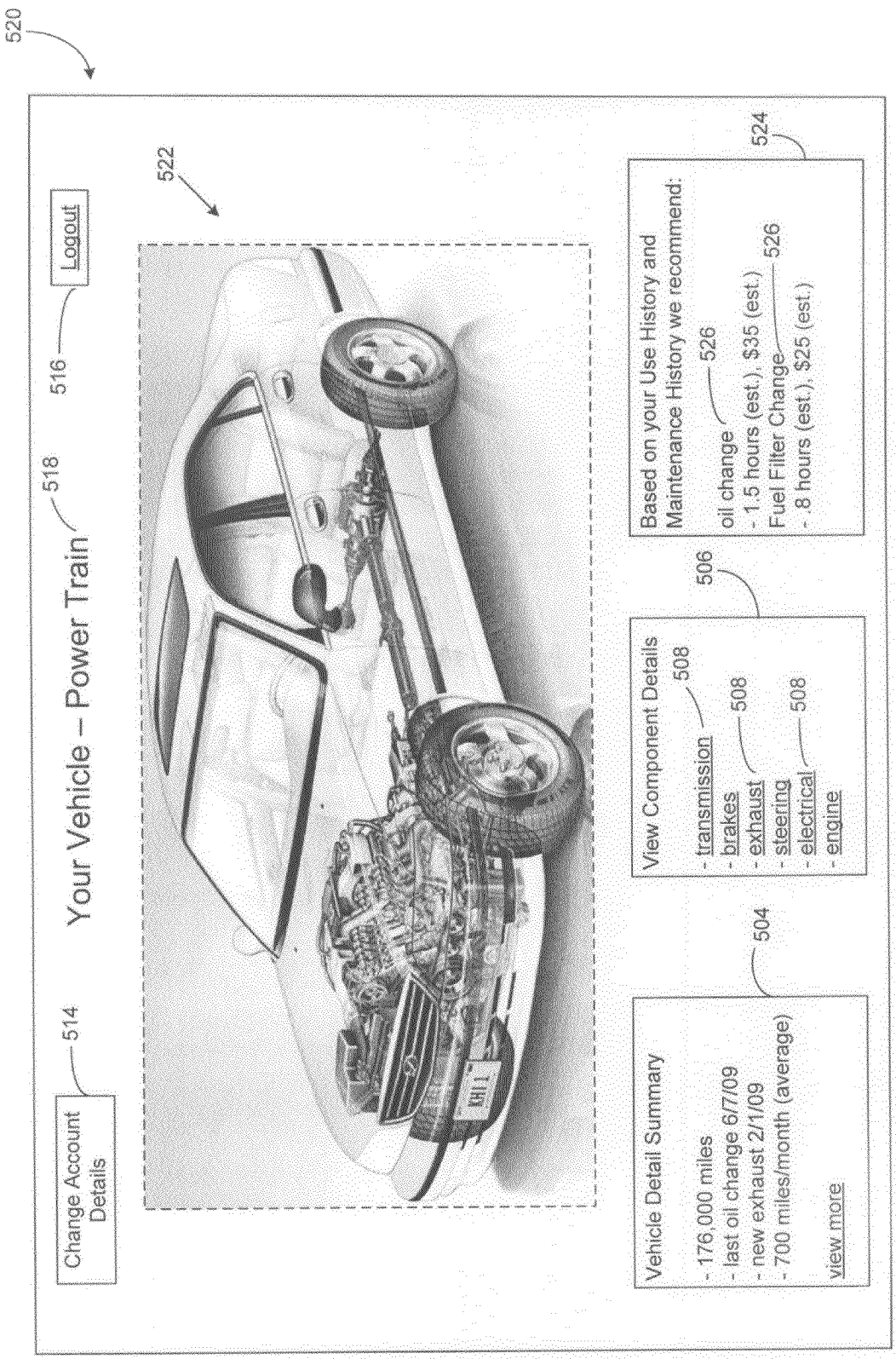
FIG. 8 illustrates an example user interface after the user has selected a particular component or subsystem of the vehicle.

FIG. 8 illustrates example user interface 520 of the present system after the user has selected a particular component or subsystem of the vehicle, for example by clicking on model 502 of user interface 500 or selecting one of the components or systems from component details section 506. User interface 520 shows a model 522 illustrating a particular component or subsystem of a user's vehicle (in the figure, the power train engine system is shown) that was selected by a user (see, for example, step 408 of FIG. 6). As described above, the contents of model 522 may be selected in accordance with the use history and/or maintenance history of the user's vehicle. As such, model 522 may show particular wear and tear that would be expected to be found in the engine system of the user's vehicle.

User interface 520 includes a listing of maintenance activities 524 that are directed to the particular vehicle component or subsystem being displayed by user interface 520. In this example, because the model 522 being shown includes the engine system, maintenance recommendations 526 include maintenance activities that may be performed on the engine system. Listing of maintenance activities 524 may include additional information to describe each maintenance activity. For example, the listing may include a description, estimated cost, estimated number of hours to complete, recommended parts, and the like. The contents of listing of maintenance activities 524 may only include those maintenance activities that the system determines to be most appropriate for the user's vehicle based upon the vehicle's use history and maintenance history.

Figure 9:
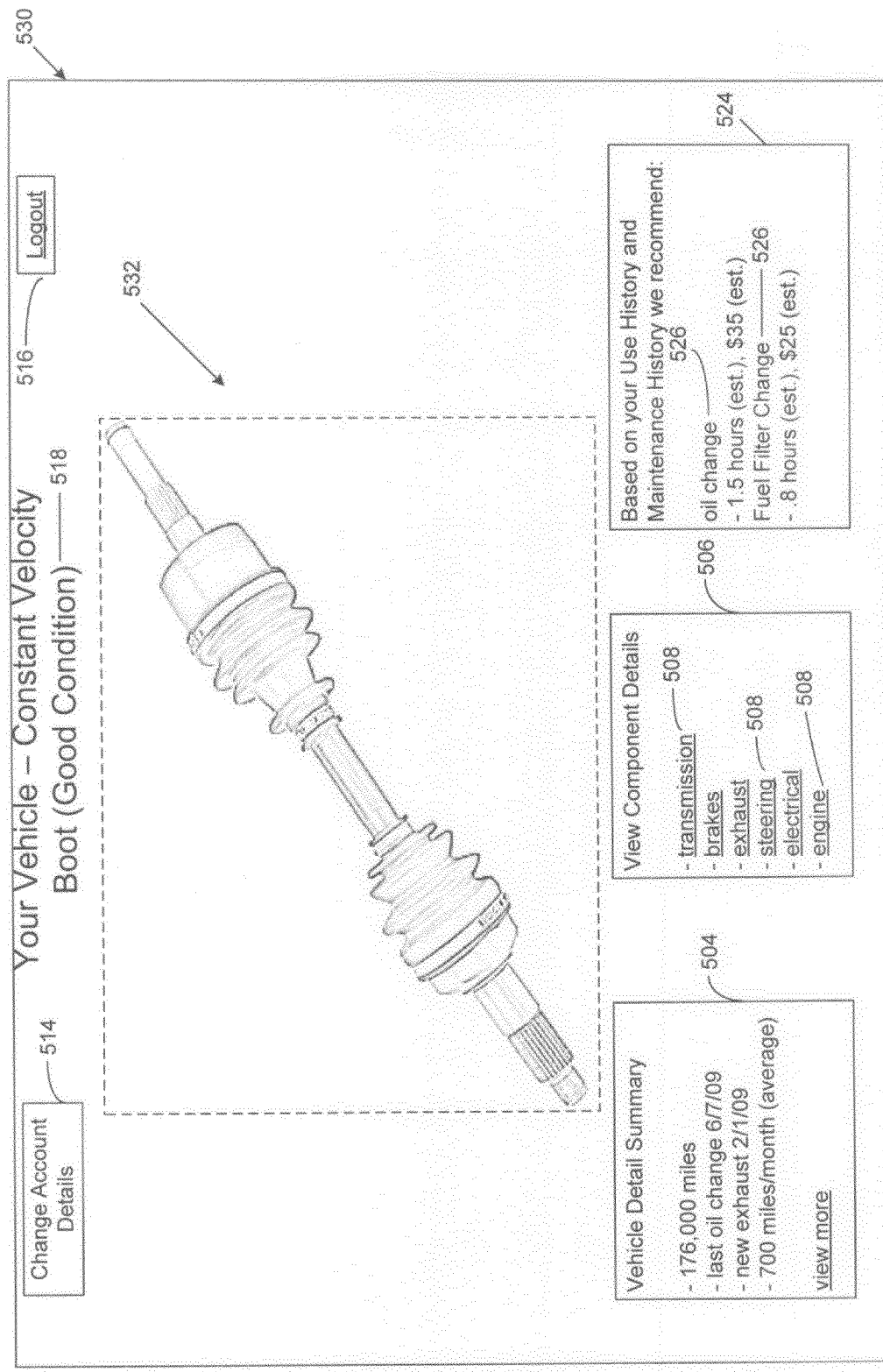
FIG. 9 illustrates an example user interface of the present system after the user has selected a particular component or subsystem of the vehicle showing the component in good working order.

FIG. 9 illustrates example user interface 530 of the present system after the user has selected a particular component or subsystem of the vehicle. User interface 530 shows model 532 illustrating a particular component or subsystem of a user's vehicle (in the figure, the constant velocity boot and axle are shown) that was selected by a user (see, for example, step 408 of FIG. 6). As described above, the contents of model 532 may be selected in accordance with the use history and/or maintenance history of the user's vehicle. As such, model 532 may show particular wear and tear that would be expected to be found in the engine system of the user's vehicle. In FIG. 9, however, model 532 provides an illustration of the CV boot system in good repair. For example, based upon the use history and/or maintenance history of the user's vehicle, the system may determine that the CV boot system in the user's vehicle has received any necessary maintenance and has not be exposed to such extreme use. Therefore, the system may display a model of the CV boot system showing the boot in good repair.

Figure 10:
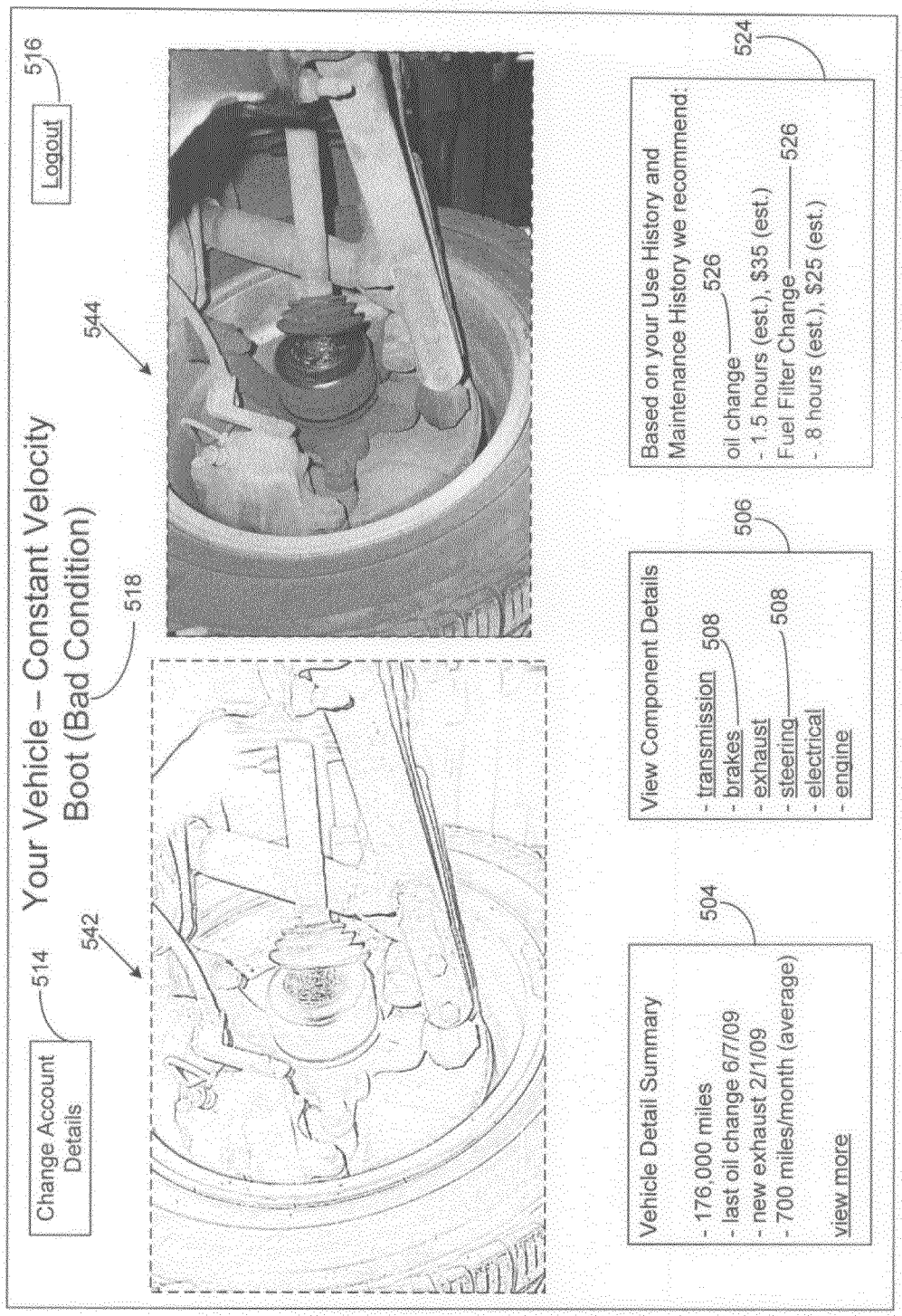
FIG. 10 illustrates an example user interface of the present system after the user has selected a particular component or subsystem of the vehicle and the system determines that the component or subsystem has, or is likely to, fail.

In contrast, FIG. 10 illustrates example user interface 540 of the present system after the user has selected a particular component or subsystem of the vehicle and the system determines that the component or subsystem has, or is likely to, fail. User interface 540 shows model 542 illustrating a particular component or subsystem of a user's vehicle (in the figure, the constant velocity boot and axle are shown) that was selected by a user (see, for example, step 408 of FIG. 6). In the present example model 542 includes a line drawing of the CV boot and shows the boot after a failure. User interface 540 also shows model 544 that provides a photographic illustration of the same part having failed. As described above, the contents of models 542 and 544 may be selected in accordance with the use history and/or maintenance history of the user's vehicle. Accordingly, in FIG. 10, however, models 542 and 544 provide an illustration of the CV boot system in poor repair and having failed. For example, based upon the use history and/or maintenance history of the user's vehicle, the system may determine that the CV boot system has not received necessary maintenance or has been exposed to extreme use. As such, the system may display a boot in poor repair or having failed.

Although the present disclosure provides several example implementations of the present system relating to the visualization and analysis of a vehicle, a person of ordinary skill in the art would recognize that the present system may be used to facilitate an understanding and maintenance of any devices that include one or more moving parts.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of displaying a visual representation of an internal component of a vehicle, comprising:
    retrieving historical data for the vehicle, the historical data describing at least one of a use history and a maintenance history of the vehicle;
    receiving a view request from a user interface, the view request identifying a component of the vehicle, wherein the component comprises a mechanical device of a subsystem of the vehicle and the subsystem is for an automobile;
    retrieving model data from a model database, the model data identifying a plurality of models of the component of the vehicle, each of the plurality of models having one or more model triggers and including a visual representation of the component of the vehicle, the model triggers characterizing a level of at least one of wear and damage of the component of the vehicle;
    evaluating each of the model triggers using the historical data, wherein each of the model triggers includes one or more logical statements concerning the historical data for the one of the plurality of models of the component, which if the one or more logical statements concerning the historical data for the one of the plurality of models of the component is satisfied, then a likely condition of the mechanical device of the subsystem of the vehicle is displayed on the user interface;
    when the model trigger for one of the plurality of models of the component of the device is satisfied whereby the one or more logical statements of the model trigger concerning the historical data for the one of the plurality of models of the component is satisfied, displaying the visual representation of the component of the one of the plurality of models using the user interface,
    wherein the visual representation of the component on the user interface comprises the mechanical device of the subsystem of the vehicle,
    wherein the visual representation of the component further includes a transparent layer of the subsystem over the component to illustrate the component relative to the subsystem of the vehicle,
    wherein the user interface is configured to include an interactive exploration of an inner working of at least one of the subsystem and the mechanical device of the subsystem of the vehicle,
    wherein the interactive exploration includes one or more alternative visual representations of the inner working of the at least one of the subsystem and the mechanical device of the subsystem of the vehicle; and
    displaying a list of available maintenance activities for the component of the vehicle using the user interface, wherein the list is based on the satisfaction of the one or more logical statements concerning the historical data for the one of the plurality of models of the component.

2. The method of claim 1, wherein the model trigger includes a geographical location of the device.

3. The method of claim 1, wherein displaying a list of available maintenance activities includes:
    retrieving candidate maintenance activities for the component of the vehicle, each candidate maintenance activity including a maintenance trigger and identifying a description of the maintenance activity;
    evaluating each of the maintenance triggers using the historical data; and
    for each of the maintenance triggers, when a maintenance trigger is satisfied, displaying the description of the maintenance activity associated with the satisfied maintenance trigger.

4. The method of claim 1, including:
    receiving user authentication information using the user interface; and
    using the user authentication information to identify the vehicle.

5. The method of claim 1, wherein the visual representation of the component of the vehicle includes at least one of a three-dimensional (3D) model, an animation, or an image.

6. A method of viewing a visual representation of an internal component of a device, comprising:
    retrieving historical data for the device, the historical data describing at least one of a use history and a maintenance history of the device;
    receiving a view request from a user interface, the view request identifying at least one of a component and a system of the device, wherein the component comprises a mechanical device of the system, wherein the system comprises a subsystem of an automobile;
    retrieving model data from a model database, the model data identifying a plurality of models of the at least one of a component and a system of the device, each of the plurality of models having a model trigger and including a visual representation of the at least one of a component and a system of the device;
    evaluating each of the model triggers using the historical data, wherein each of the model triggers includes one or more logical statements concerning the historical data for the component, which, if the one or more logical statements concerning the historical data for the component is satisfied, then a likely condition of the mechanical device of the system is displayed on the user interface; and
    when the model trigger for one of the plurality of models of the at least one of a component and a system of the device is satisfied whereby the one or more logical statements of the model trigger concerning the historical data for the component is satisfied, displaying the visual representation of the at least one of a component and a system of the device using the user interface,
    wherein the visual representation of the component on the user interface comprises the mechanical device of the system,
    wherein the visual representation of the component further includes a transparent layer of the system over the component to illustrate the component relative to the system.

7. The method of claim 6, wherein the model trigger includes a geographical location of the device.

8. The method of claim 6, wherein the device is a vehicle.

9. The method of claim 6, including:
    retrieving candidate maintenance activities for the at least one of a component and a system of the device, each candidate maintenance activity including a maintenance trigger and identifying a description of the maintenance activity;
    evaluating each of the maintenance triggers; and
    for each of the maintenance triggers, when a maintenance trigger is satisfied, displaying the description of the maintenance activity associated with the satisfied maintenance trigger.

10. The method of claim 9, wherein the description of the maintenance activity associated with the satisfied maintenance trigger includes at least one of an estimated cost of the maintenance activity and an estimated number of hours for the maintenance activity.

11. The method of claim 6, including:
receiving user authentication information using the user interface; and
using the user authentication information to identify the device.

12. The method of claim 6, wherein the model includes at least one of a three-dimensional (3D) model, an animation, or an image.

13. A computer-implemented method of viewing an internal component of a device, comprising:
providing a user interface;
receiving device selection criteria from the user interface;
retrieving a device model from a model database in accordance with the device selection criteria, the device model including a visual representation of the device, wherein the device comprises a mechanical device of a subsystem, wherein the subsystem is for an automobile;
displaying the visual representation of the device using the user interface, wherein the visual representation of the device using the user interface comprises displaying the mechanical device of the subsystem on the user interface;
receiving component or subsystem selection criteria from the user interface;
retrieving a component or subsystem model from a component or subsystem model database in accordance with the component or subsystem selection criteria; and
displaying the component or subsystem model using the user interface, wherein the displaying the component or subsystem further includes a transparent layer of the component or subsystem over the device to illustrate the device relative to the component or subsystem.

14. The method of claim 13, wherein the device is a vehicle.

15. The method of claim 13, including:
retrieving maintenance activities for the component or subsystem, each maintenance activity identifying a description of the maintenance activity; and
displaying the descriptions of each of the maintenance activities.

16. The method of claim 15, the descriptions of each of the maintenance activities including at least one of an estimated cost of the maintenance activity and an estimated number of hours for the maintenance activity.

17. A system for displaying a visual representation of an internal component of a vehicle, comprising:
a user information database for storing historical data for the vehicle, the historical data describing at least one of a use history and a maintenance history of the vehicle;
a model database for storing model data, the model data identifying a plurality of models of components of the vehicle, each of the plurality of models having one or more model triggers and including a visual representation of the components of the vehicle, the model triggers characterizing a level of at least one of wear and damage of the component of the vehicle; and
a processor, the processor being configured to:
retrieve historical data for the vehicle from the user information database,
receive a view request from a user interface, the view request identifying a component of the vehicle, wherein the component comprises a mechanical device of a subsystem of the vehicle, wherein the subsystem is for an automobile,
retrieve model data from the model database for the component of the vehicle,
evaluate the model triggers of the model data using the historical data, wherein each of the model triggers includes one or more logical statements concerning the historical data for the models of components, which, if the one or more logical statements concerning the historical data for the of models of components is satisfied, then a likely condition of the mechanical device of the subsystem of the vehicle is displayed on the user interface and
when a model trigger for one of the plurality of models of the component of the device is satisfied whereby the one or more logical statements of the model trigger concerning the historical data for the one of the plurality of models of the component is satisfied, display the visual representation of the component of the one of the plurality of models using the user interface,
wherein the user interface is configured to include an interactive exploration of an inner working of at least one of the subsystem and the mechanical device of the subsystem of the vehicle, and
wherein the interactive exploration includes one or more alternative visual representations of the inner working of the at least one of the subsystem and the mechanical device of the subsystem of the vehicle.

18. The system of claim 17, including:
a maintenance activities database for storing maintenance activities, each maintenance activity including a maintenance trigger and identifying a description of the maintenance activity, and wherein the processor is configured to:
retrieve candidate maintenance activities for the component of the vehicle from the maintenance activities database;
evaluate each of the maintenance triggers using the historical data; and
for each of the maintenance triggers, when a maintenance trigger is satisfied, display the description of the maintenance activity associated with the satisfied maintenance trigger.

19. The system of claim 17, wherein the processor is configured to:
receive user authentication information using the user interface; and
use the user authentication information to identify the vehicle.

20. The system of claim 17, wherein the visual representation of the component of the vehicle includes at least one of a three-dimensional (3D) model, an animation, or an image.

* * * * *